United States Patent [19]
Suzuki et al.

[11] Patent Number: 5,095,752
[45] Date of Patent: Mar. 17, 1992

[54] CAPACITANCE TYPE ACCELEROMETER

[75] Inventors: Seiko Suzuki, Hitachioota; Shigeki Tsuchitani, Mito; Masayuki Miki, Katsuta; Masahiro Matsumoto, Hitachi, all of Japan

[73] Assignee: Hitachi, Ltd., Tokyo, Japan

[21] Appl. No.: 429,546

[22] Filed: Oct. 31, 1989

[30] Foreign Application Priority Data
Nov. 15, 1988 [JP] Japan .................. 63-286714

[51] Int. Cl.$^5$ ................................ H01L 21/283
[52] U.S. Cl. ..................... 73/517 R; 73/517 B; 437/67
[58] Field of Search ............. 73/517 R, 517 B; 437/61, 67, 187, 195, 915, 980

[56] References Cited

U.S. PATENT DOCUMENTS

| | | | |
|---|---|---|---|
| 4,400,214 | 8/1983 | Ogawa et al. | 106/1.13 |
| 4,483,194 | 11/1984 | Rudolf | 73/517 R |
| 4,679,434 | 7/1987 | Stewart | 73/517 B |
| 4,746,963 | 5/1988 | Uchida et al. | 437/67 |
| 4,849,374 | 7/1989 | Chen et al. | 437/209 |
| 4,874,719 | 10/1989 | Kurosawa | 437/195 |
| 4,922,756 | 5/1990 | Henrion | 73/517 R |
| 4,963,505 | 10/1990 | Fujii et al. | 437/62 |

Primary Examiner—Hezron E. Williams
Assistant Examiner—Craig Miller
Attorney, Agent, or Firm—Antonelli, Terry, Stout & Kraus

[57] ABSTRACT

A capacitance type accelerometer, having a fist silicon plate formed a movable electrode which is moved according to acceleration, two second silicon plates which are disposed on both sides of the first silicon plate with a certain separation distance, and thermal oxide films which are respectively disposed between the first silicon plate except the movable electrode and the two second silicon plates and stick the first silicon plate except the movable electrode and the two second silicon plates together. And further, a capacitance type accelerometer, having, a silicon plate forming a movable electrode which is moved according to acceleration, glass plates respectively mounting a conductive layer thereon which are opposite to the silicon plate with a certain separation distance and are connected to both sides of the silicon plate except the movable electrode and lead wires which are respectively connected to the conductive layers through a groove formed between the silicon plate and the glass plates.

11 Claims, 17 Drawing Sheets

CAPACITANCE TYPE ACCELEROMETER

BACKGROUND OF THE INVENTION

The present invention relates to a capacitance type accelerometer using a semiconductor and more particularly to an electro-static capacitance type accelerometer suitable for body control or engine control of an automobile.

It is required for an accelerometer for an automobile to detect acceleration of relative-low level (0 through ±1.0G) and the low frequency (0 to 10 Hz) at high accuracy. In addition, $1G = 9.8 \text{ m/S}^2$ herein.

Such accelerometer, as well-known, includes a piezoelectric sensor conventionally utilizing a piezoelectric effect of a piezoelectric material, an electromagnetic servo system sensor having an electromagnetic feedback mechanism, a magnetic sensor utilizing a differential transformer, an optical sensor utilizing a photointerrupter, and a strain gauge system or a capacitance system sensor utilizing a fine processing technique of silicon. Among them the capacitance type accelerometer utilizing the fine processing technique of silicon is considered the most favorable, which can detect acceleration of the low frequency at high accuracy and provide an inexpensive sensor.

The largest problem for packaging the capacitance type accelerometer is the package of the lead for the electrode. Therefore, several methods are known.

A first example, as disclosed in U.S. Pat. No. 4,483,194, is a method to fetch the lead for the movable electrode or the fixed electrode through a P+diffusion region. The method has the problem in that etching is complicated and yield when bonded is poor, the P+ diffusion region becomes a large stray capacitance, and its voltage dependency is large, thereby deteriorating the detection system.

A second example, as shown in Pages 336 to 339, Transducers '87 (the 4th International Conference on Solid-State Sensors and Actuators), is a method to fetch the lead from a gap at the bonding portion of the silicon plate and a glass base. The method, when a detected chip is diced by a usual dicing saw after the silicon plate and glass base are bonded in the wafer state, water content or chips enters into a space around the electrode through the gap, thereby creating the problem in that the performance as the accelerometer is not obtainable.

A third example, as disclosed "Miniature Silicon capacitance absolute pressure sensor", Page 255 to 260, I Mech E, 1981, is a method to fetch the lead through a bore perforating a glass base. This example is applied to the pressure sensor, in which the problem is created in the poor lead connection at one bore end caused by variation in metallizing condition and the temperature characteristic deterioration caused by a large difference in coefficient of thermal expansion between the solder charged in the other bore end and the glass base.

A fourth example, as shown in U.S. Pat. No. 4,609,968, is a method of using a silicon plate to the fixed electrode to package the silicon plate itself as part of the lead. In this example, a silicon plate to be the fixed electrode is applied at the periphery thereof with glass powder and baked and then polished at the surface to be like a mirror. A movable electrode and a silicon plate having a beam for supporting the electrode are laminated and bonded with anodic-bonding. The anodic bonding is to apply high voltage at a high temperature to glass and silicon to be bonded, in which the movable electrode is displaced by an electrostatic force and contacts with the silicon plate of fixed electrode so as to be discharged, whereby both the members cannot be bonded. In order to avoid this, a gap between the movable electrode and the fixed electrode must be previously designed to be larger, or a spring constant of the beam must be designed to be larger (in brief, deformation of the movable electrode with respect to the unit acceleration). As the result, the problem is created in that high sensitivity essentially possessed by the capacitance type accelerometer must largely be sacrificed.

The above-mentioned conventional technique is not considered as to the electrode lead package method, thereby creating the problem in the productivity, detection accuracy or sensitivity.

SUMMARY OF THE INVENTION

An object of the present invention is to provide an accelerometer superior in productivity, high in performance, and inexpensive to produce.

The above objects is attained by the following methods.

A first method is to laminate the silicon plate used also as the fixed electrode through the thermal oxidation films on the upper surface (one surface) and the lower surface (the other surface) of the silicon plate having the silicon beam and movable electrode, which are directly bonded at a high temperature.

A second method is that glass plates having fixed electrodes are anodic-bonded in the wafer condition to the upper and lower surfaces of a silicon plate having a silicon beam, a movable electrode and a shallow groove, so that a lead wire of fixed electrode is fetched from the groove at the bonding portion, thereby obtaining detection chips by laser dicing.

A third methods is to form a shallow groove at part of a glass plate forming thereon the fixed electrode and to form a lead terminal of fixed electrode at the bottom of the groove and thereafter the groove in part is sealed by an insulating material.

A fourth method is to bond by a low-melting-point glass adhesive a silicon plate serving also as the fixed electrode onto the upper and lower surfaces of a silicon plate having a silicon beam and a movable electrode.

A fifth method is that glass plates having the fixed electrodes are anodic-bonded onto the upper and lower surfaces of a silicon plate having a silicon beam and a movable electrode, in which a conductive material is filled into a through hole formed at a glass plate.

A sixth method is that glass plates having fixed electrodes are anodic-bonded onto the upper and lower surfaces of a silicon plate having the silicon beam and movable electrode, in which the glass plate is anode-bonded onto the silicon plate through a polycrystal silicon layer on a thermal oxidation film formed on the silicon plate so that a lead-out terminal for the fixed electrode is fetched while contacting with the polycrystal silicon layer.

A seventh method is that a glass plate having the fixed electrode is anodic-bonded onto the upper and lower surfaces of a silicon plate having the silicon beam and movable electrode, in which a lead for the fixed electrode is drawn out on a thermal oxidation film formed to a minimum on the silicon plate.

For the first method, the silicon plate serving also as the fixed electrode functions by itself as a lead-out terminal for the fixed electrode so as to simplify the package method for the lead. As the result, an accelerometer superior in productivity and inexpensive to produce is realizable. In addition, since the anodic-bonding method is not used for the bonding technique, a gap between the movable electrode and the fixed electrode is reducible by several microns or less and the spring constant of silicon beam is reducible, whereby high sensitivity essentially possessed by the capacitance type accelerometer can be obtained to thereby realize the acceleration sensor of high performance.

For the second method, since the lead of fixed electrode is fetched from the groove, the lead terminal and silicon plate can be insulated by air from each other, thereby simplifying the package of the lead. In addition, since the laser performs dicing, water content or chips are prevented from entering into the space around the electrode. As the result, the accelerometer superior in productivity and inexpensive to produce is realizable.

For the third method, since a lead terminal is formed at the bottom of groove and part thereof is sealed with an insulating material, even when dicing is applied by a dicing saw to detecting chips, water content or chips are prevented from entering into the space around the electrode. As the result, the accelerometer superior in productivity and inexpensive to produce is realizable.

For the fourth method, since the silicon plates also serves as the fixed electrode, the same effect as the first method is obtained for the same reason.

For the fifth method, since the conductive material is completely filled in the through hole at the glass plate, the lead terminal at the hole end is completely prevented from poor connection, thereby improving a yield on production.

For the sixth method, even when the lead terminal of fixed electrode contacts with the polycrystal silicon layer, the thermal oxidation film is below the fixed electrode, whereby the lead can be drawn out while keeping electrical insulation from the silicon plate. Since the lead terminal may contact with the polycrystal silicon layer, the lead terminal is reduced in thickness, so that a gap in the vicinity of the lead created when the silicon plate and glass plate are anodic-bonded, becomes smaller as much as neglected. Hence, even when the detected chip is cut by the dicing saw, water content or chips are prevented from entering into the space around the electrode.

For the seventh method, the thermal oxidation film insulating the lead of fixed electrode from the silicon plate is minimum and a gap generated in the vicinity of the film is small, whereby even when the dicing saw cuts the detected chip, water content or chips are prevented from entering into the space around the electrode.

DETAILED DESCRIPTION OF THE PREFERRED EMBODIMENTS

Figure 1:
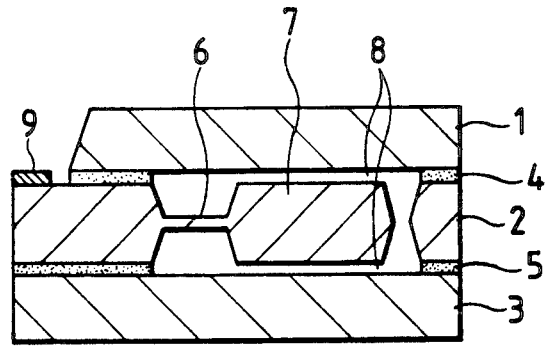
FIG. 1 is a diagrammatic cross-sectional view showing an embodiment of an accelerometer in the present invention.

Next, the accelerometer of the present invention will be detailed in accordance with an embodiment shown in the drawing.

FIG. 1 shows an embodiment of the present invention which utilizes the first method. A detection unit of the embodiment of the capacitance type accelerometer comprises a silicon plate 1, a silicon plate 2 and a silicon plate 3, which are directly laminated and bonded through electrical insulating thermal oxidation films 4 and 5. At the silicon plate 2, a silicon beam 6 (a bridge-like portion) and a movable electrode 7 are preformed by etching prior to the bonding. The movable electrode 7 functioning as a weight is supported by the silicon beam 6, and gaps 8 between the movable electrode 7 and the silicon plates 1 and 3 change in dimension corresponding to the magnitude of acceleration in the vertical direction in the drawing and acting on the movable electrode 7. The silicon plates 1 and 3 opposite to the movable electrode 7 and formed of conductive material can be electrodes which are not moved by the acceleration, in other words, the plates 1 and 3 are stationary or fixed electrodes. The capacitance between the electrodes at the gap 8 varies corresponding to the acceleration acting on the detection unit, so that the acceleration is detected by use of the variation in the capacitance.

The movable electrode 7 is electrically connected with an external electronic circuit (not shown) through the silicon beam 6 and a bonding pad 9.

As above-mentioned, since the silicon plates 1 and 3 serve also as the fixed electrodes, they are usable as the lead-out terminals of the fixed electrodes, thereby extremely simplifying the lead package method.

Meanwhile, in a case of this embodiment, electric capacitance at the bonding portions (parts 4 and 5 of thermal oxidation film in the drawing) between the silicon plate 2 and the silicon plates 1 and 3 is inserted in parallel to the electric capacitance at the gaps 8. The capacitance of the bonding portion becomes stray capacitance not at all affected by variation in acceleration. Accordingly, the electric capacitance at this part is desired to be as small as possible. For this purpose, an area of bonding portion should be as small as possible, and on the other hand, the thermal oxidation films 4 and 5 should be as large as possible.

Figure 2:
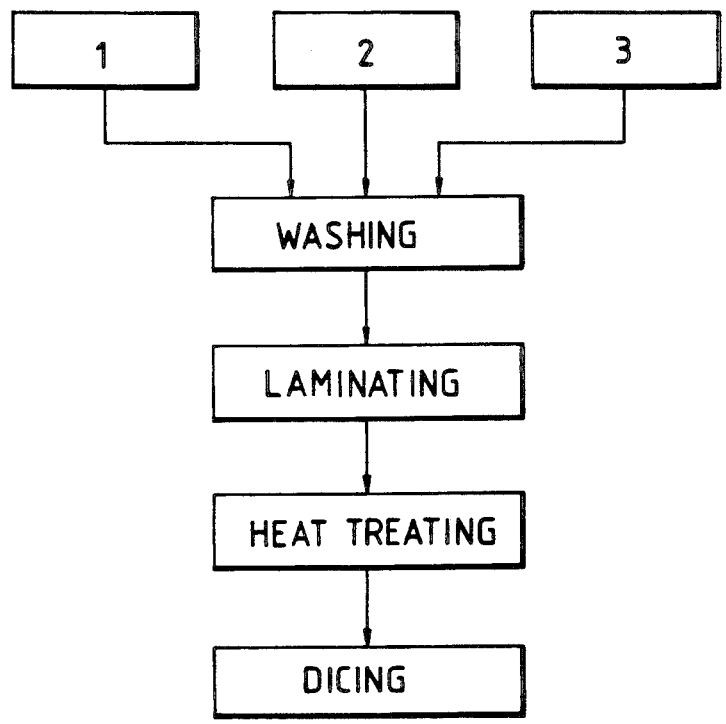
FIG. 2 is a diagrammatic view showing an embodiment of a manufacturing process of the accelerometer shown in FIG. 1.

A schematic manufacturing process of the detection unit shown in FIG. 1 is shown in FIG. 2, in which the silicon plates 1, 2 and 3 in the wafer state after completion of etching process and other pre-processings are fully cleaned to remove stain or dust from the bonding portion. Next, the silicon plates in the wafer state are aligned and thereafter laminated, and subjected to heat treatment for 2 hours, at a temperature of 800° C., and in the oxygen atmosphere. The heat treatment can completely and directly bond the silicon plates with each other through the thermal oxidation films. Lastly, the three-layer bonded wafer of silicon is cut by the dicing saw, thereby enabling a large number of accelerometer assemblies shown in FIG. 1 to be simultaneously manufactured.

In this embodiment of the sensor which directly bonds the silicon plates only by the heat treatment, differently from the anodic-bonding method to apply high voltage, even when the size of gap 8 or the spring constant of silicon beam 6 is reduced, the problems are encountered during the manufacturing, thereby obtaining an accelerometer of high sensitivity with ease.

Figure 3:
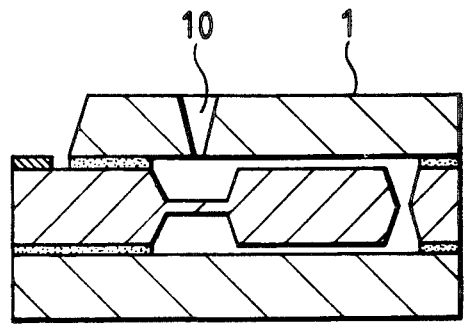
FIGS. 3 and 4 are diagrammatic cross-sectional views showing another embodiments of the accelerometers in the present invention.
Figure 4:
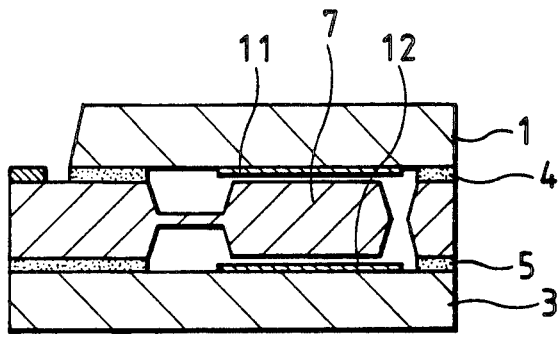

Other modified embodiments of the detection unit of the invention will be shown in FIGS. 3 and 4. In addition, in the following drawings, the same reference numerals show the components of the same functions.

When the silicon plates are directly bonded with each other by the method shown in FIG. 2, gas filled in the space around the movable electrode 7 and silicon beam 6 expands depending on a rate of heating up to the heat treatment temperature and the kind of atmospheric gas, whereby a gap is generated at part of laminated silicon plates 1, 2 and 3 to be bonded, whereby the bounding in the wafer state during the heat treatment may partially be improper.

Therefore, as shown in the FIG. 3 embodiment, it is extremely effective to form at the silicon plate 1 a bore 10 serving for escape of the expanded gas to the atmosphere.

Next, when the silicon capacitance type accelerometer is intended to extremely improve its sensitivity, the construction of detection unit shown in FIG. 4 is effective. The FIG. 4 embodiment forms polycrystal silicon layers 11 and 12 at parts of silicon plates 1 and 3 opposite to the movable electrode 7. Here, the polycrystal silicon layers 11 and 12 are of conductive material and substantially become fixed electrodes opposite to the movable electrode 7.

Accordingly, in the FIG. 4 embodiment, the gaps between the movable electrode 7 and the polycrystal silicon layers 11 and 12 are reduced in width, thereby enabling an accelerometer of high sensitivity to be obtained. Also, since each gap can be of smaller width than thickness of each thermal oxidation film 4 or 5, the stray capacitance at parts of thermal oxidation films 4 and 5 is relative-reduced. In addition, the polycrystal silicon layers 11 and 12 fundamentally need only be conductor layers, which may be constructed of a metal layer, such as platinum.

FIGS. 5 through 8 are developed views of the construction of detection unit shown in the FIG. 1 embodiment before being laminated.

Figure 5:
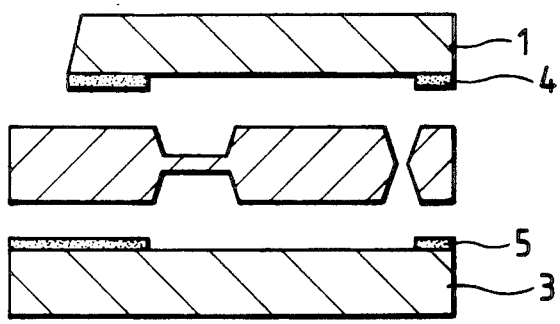
FIGS. 5, 6, 7 and 8 are developed cross-sectional views of the accelerometer shown in FIG. 1.

In FIG. 5, electrically insulating thermal oxidation films 4 and 5 are preformed only at the bonded portion between the silicon plates 1 and 3, and of at least 1 micron or more in thickness.

Figure 6:
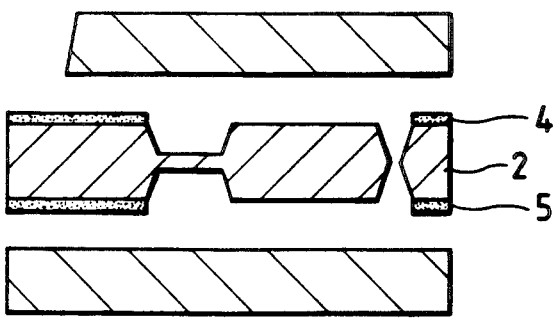

Conversely, in the FIG. 6 embodiment, the thermal oxidation films 4 and 5 are formed only at the bonding of silicon plate 2.

Figure 7:
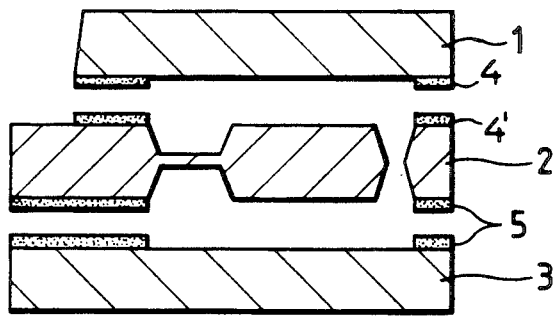

In the FIG. 7 embodiment, the thermal oxidation films 4, 4' and 5, 5' are preformed at all the silicon plates 1, 2 and 3, which is more favorable than the embodiments in FIGS. 5 and 6 in order to reduce the stray capacitance at the parts after being bonded.

Figure 8:
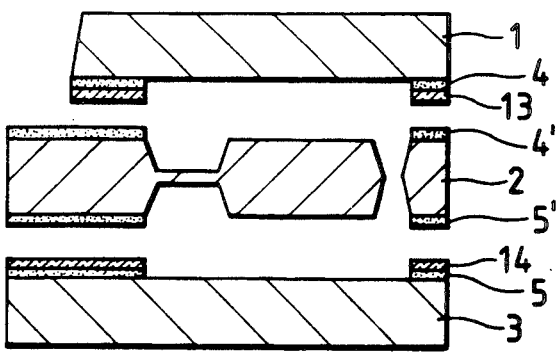

In the, FIG. 8 embodiment, thin glass layers 13 and 14 are preformed by spin coat on a thermal oxidation film 4 at the silicon plate 1 and on film 5 at the silicon plate 3, the glass layers 13 and 14 being inserted between the thermal oxidation films 4 and 5 and serving as a low temperature adhesive in the heat treatment during the bonding, thereby enabling bonding of silicon plates with each other at a low temperature.

Figure 9A:
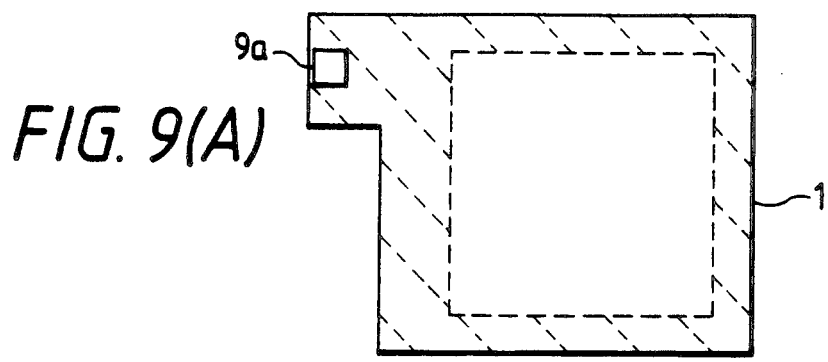
FIG. 9(A), 9(B) and 9(C) are developed plane views of the embodiment of the accelerometer shown in FIG. 7.
Figure 9B:
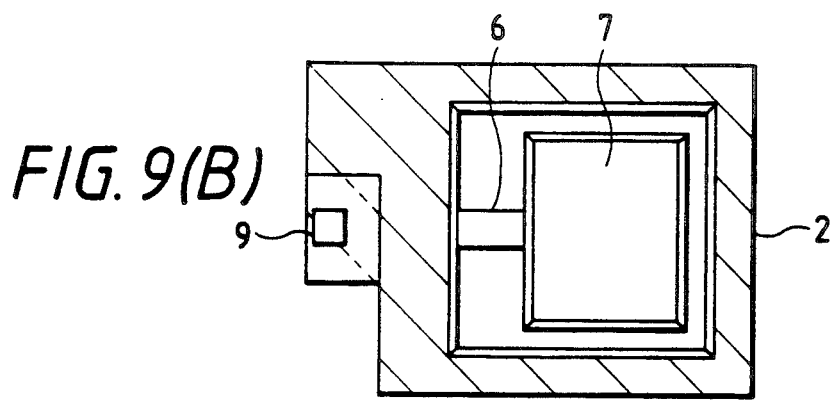
Figure 9C:
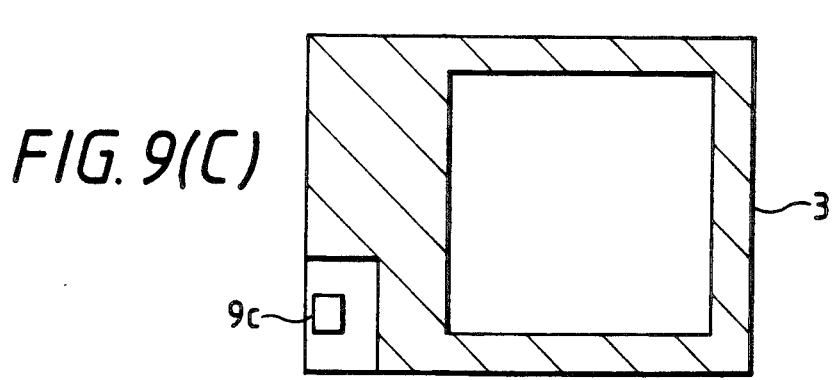

FIGS. 9(A), 9(B) and 9(C) are developed plan views of the detection unit of the silicon capacitance type accelerometer of the present invention shown in FIG. 7 in which hatched portions show parts of thermal oxidation film as the bonding portion of silicon plates with each other. Reference numerals 9a, 9 and 9c designate respective bonding pads of the silicon plate 1 (functioning as a fixed electrode), movable electrode 7, and silicon plate 3 (functioning as a fixed electrode), the electrodes being connected with an external signal processing unit.

Figure 10:
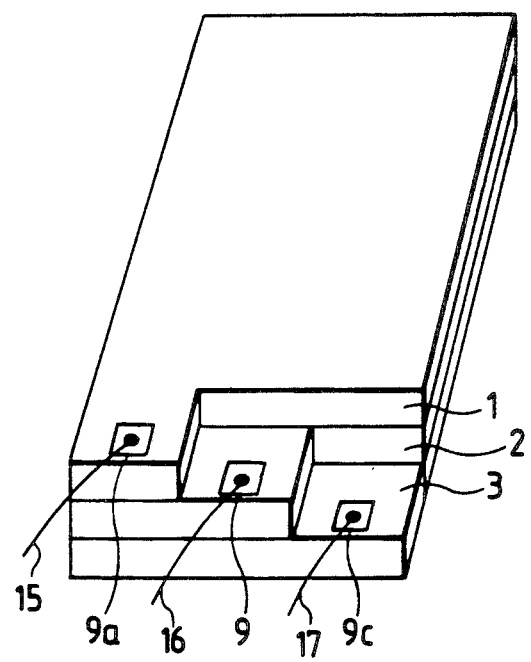
FIG. 10 is an elevation of an embodiment of the accelerometer shown in FIGS. 9(A), 9(B) and 9(C).

FIG. 10 is an elevation view of the detection unit of the accelerometer of the invention, the detection unit being electrically connected with the external signal processing circuit through lead wires 15, 16 and 17.

Figure 11A:
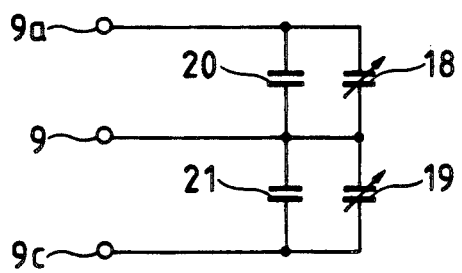
FIGS. 11(A) and 11(B) are equivalent circuits of the accelerometer.
Figure 11B:
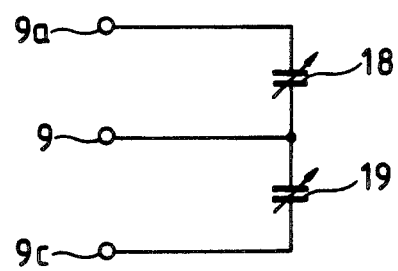

FIG. 11 shows an equivalent circuit of the detection unit. In FIG. 11(A), capacitances 18 and 19 are capacities at the gap 8 between the electrodes, which change corresponding to magnitude of acceleration. While, capacitances 20 and 21 are those of the thermal oxidation film at the silicon plate bonding portion, which are not at all affected by the acceleration. Therefore, the capacitances 20 and 21 are made sufficiently smaller in magnitude than those 18 and 19, so that it is desirable to indicate the equivalent circuit substantially in FIG.

11(B). Therefore, it is effective to reduce an area of bonding, to make the thermal oxidation film larger in thickness, to enlarge the area of the movable electrode, and to reduce the dimension of the gap between the electrodes.

Next, explanation will be given on the positioning method of the silicon wafer when the silicon plate is directly bonded by the heat treatment in the wafer state.

Figure 12A:
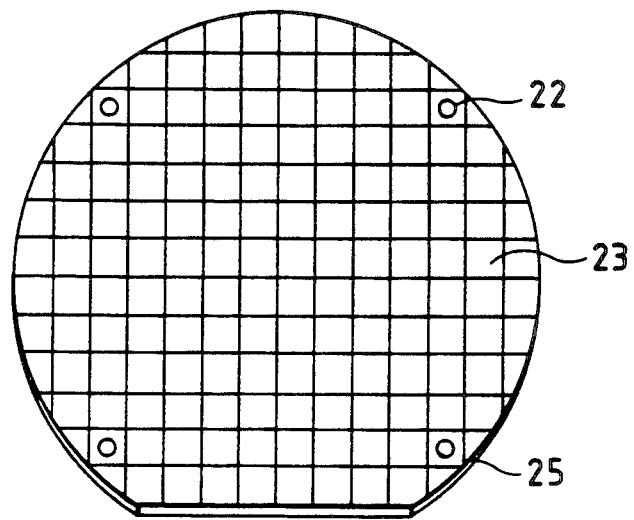
FIGS. 12(A) and 12(B) are illustrations of a positioning method for a silicon plate in the wafer state at the embodiment of the present invention.

FIG. 12(A) is a schematic view of a silicon plate 25 in the wafer state, in which reference numeral 23 designates detection chips, so, that one wafer can produce several hundred accelerometers, and a plurality of through bores 22 are formed at the silicon plate 25 by etching.

Figure 12B:
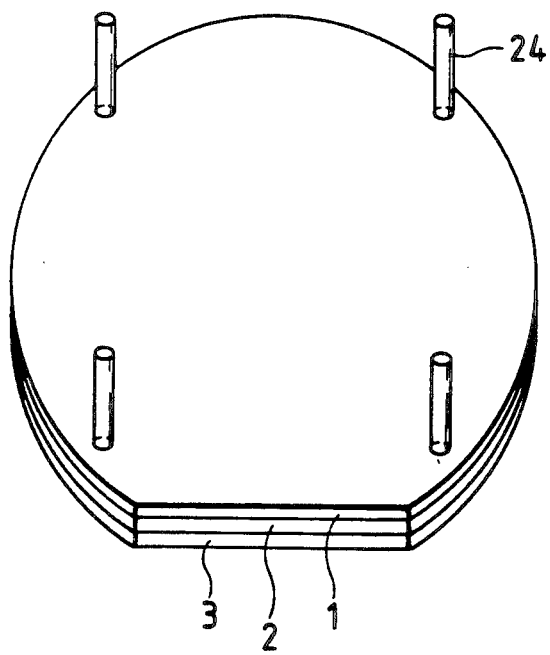

Next, as shown in FIG. 12(B), guide pins 24 are inserted into the through bores 22 so that the silicon plates 1, 2 and 3 are laminated and simultaneously positioned to each other.

Accordingly, in this embodiment, the positioning accuracy between the silicon plates depends on tolerance between each through bore 22 and the guide pin 24, thereby enabling positioning by accuracy of ± several 10 microns or less.

Figure 13:
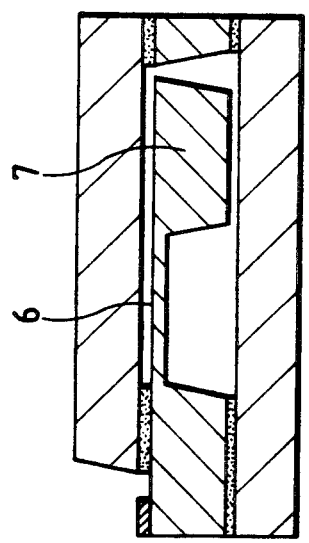
FIGS. 13, 14, 15 and 16 are developed plane views of the another embodiments of the accelerometer.
Figure 14:
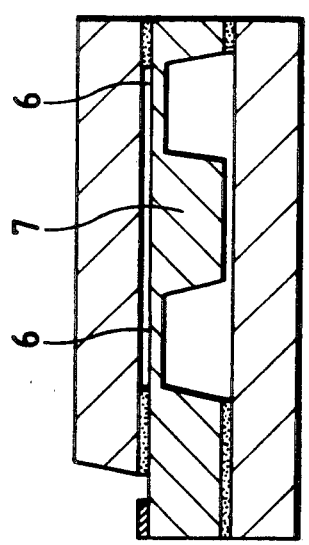

Other modified embodiments of the detection unit of the silicon capacitance type accelerometer of the invention are shown in FIGS. 13 and 14 (sectional views) and 15 and 16 (plan views).

At first, FIG. 13 shows an example in which a movable electrode 7 is held by a silicon beam 6 in a cantilever fashion, which is different from the FIG. 1 embodiment in that the silicon beam 6 is not disposed on the axis of gravity of movable electrode 7.

Next, in FIG. 14, the movable electrode 7 is supported by two silicon beams 6 in a both-ends support fashion.

Figure 15:
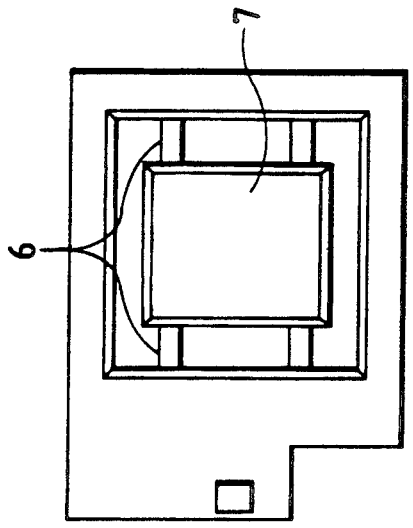
Figure 16:
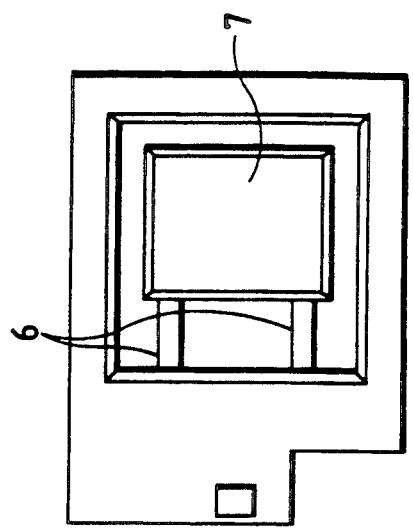

FIGS. 15 and 16 show the detection units in which the electrodes 7 are respectively supported by four silicon beams 6 in the both-ends support fashion and by two silicon beams 6 in the cantilever fashion.

Next, explanation will be given on another modified embodiment of the capacitance type accelerometer of the invention, which adopts a different packaging method (2nd method) of the electrode lead.

Figure 17:
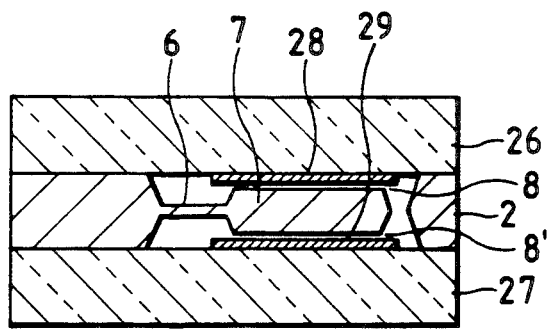
FIGS. 17 and 18 are diagrammatic cross-sectional views showing another embodiments of the electrode lead package method in the present invention.
Figure 18:
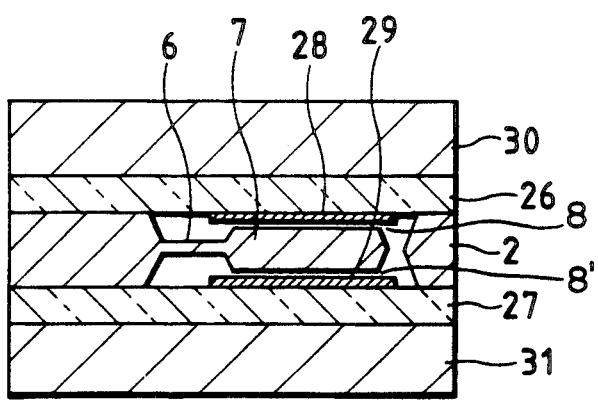

In this embodiment, sectional constructions of the detection unit are shown.. in FIGS. 17 and 18. Firstly, in FIG. 17, fixed electrodes 28 and 29 comprise conductive layers formed of metal, such as aluminum, by sputtering or other methods. An anodic-bonding is used for bonding the glass plates 26 and 27 onto the upper and lower surfaces of silicon plate 2. In other words, high voltage at a high temperature (for example, 200V at 380° C.) is applied to electro-chemically bond the glass plates onto the both surfaces of silicon plate 2.

In the FIG. 18 embodiment, onto the glass plates 26 and 27 in the construction shown in FIG. 17 are anodic-bonded silicon plates 30 and 31, the glass plates each using borosilicate glass about equal in thermal expansion coefficient to the silicon plate. However, since both the thermal expansion coefficients are not completely equal, when the temperature around the detection unit varies, the gaps 8, 8' between the electrodes somewhat changes in dimension. As the result, an output signal of the accelerometer is affected by the temperature so as to slightly vary from its calibrated zero. For this point, in the FIG. 18 embodiment, the glass plates 26 and 27 are reduced in thickness so that the detection unit is entirely and substantially equivalent to that formed only of silicon laminated member, thereby enabling a capacitance type accelerometer superior in temperature characteristic to be obtained. In addition, as discussed below, the method to pick up the lead from the fixed electrodes 28 and 29 is made equal to the FIG. 17 embodiment.

Figure 19A:
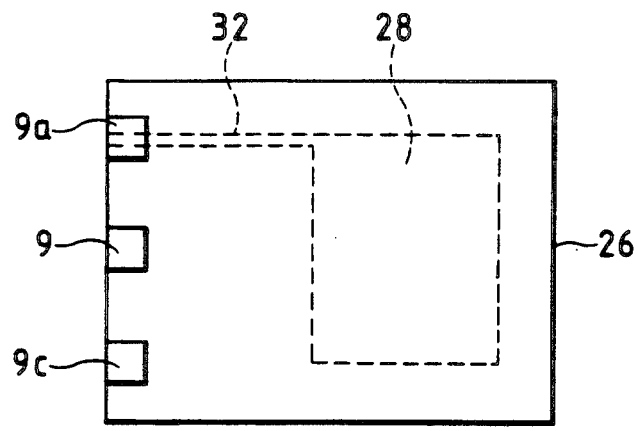
FIGS. 19(A), 19(B) and 19(C) are developed plane views of the embodiments of the accelerometer shown in FIG. 17.
Figure 19B:
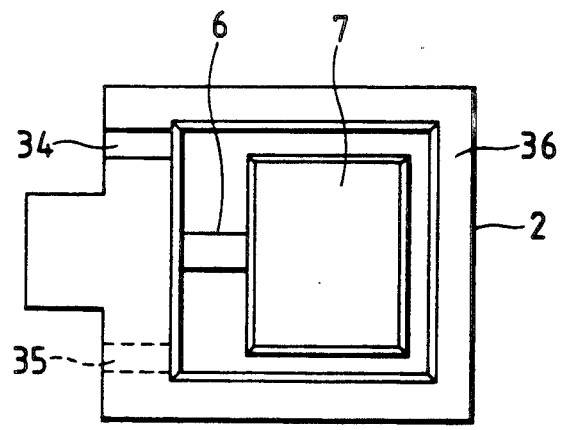
Figure 19C:
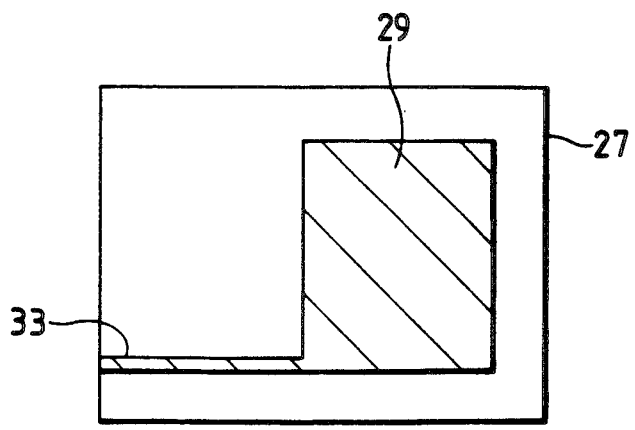

FIGS. 19(A), 19(B) and 19(C) are developed plan views of the detection unit shown in FIG. 17, in which part of silicon plate 2 shown by the broken line is a junction.

In FIGS. 19(A), 19(B) and 19(C) reference numerals 32 and 33 designate lead-out terminals for electrically connecting the fixed electrodes 28 and 29 with an external signal processing circuit. In order not to contact the lead-out terminals 32 and 33 with the silicon plate 2, in other words, in order to aim at electrical insulation of the fixed electrodes 28 and 29 from the silicon plate 2, the silicon plate 2 is shallowly etched to form a groove 34 on the upper surface and a groove 35 on the lower surface. The lead-out terminals 32 and 33 are disposed at the positions opposite to gaps at the junction, that is, the grooves 34 and 35 created when the glass plates 26 and 27 are bonded onto the upper and lower surfaces of silicon plate 2. In addition, a depth of each groove 32 or 33 is smaller than a width of at least the gap 8 between the movable electrode 7 and the fixed electrodes 28 and 29.

After the glass plates 26 and 27 are anodic-bonded in the wafer state onto the upper and lower surfaces of silicon plate 2, a laser dicing is used to cut them into detection chips. Hence, there is no fear that water content or chips enters into the space around the movable electrode 7 through the grooves 34 and 35.

Figure 20:
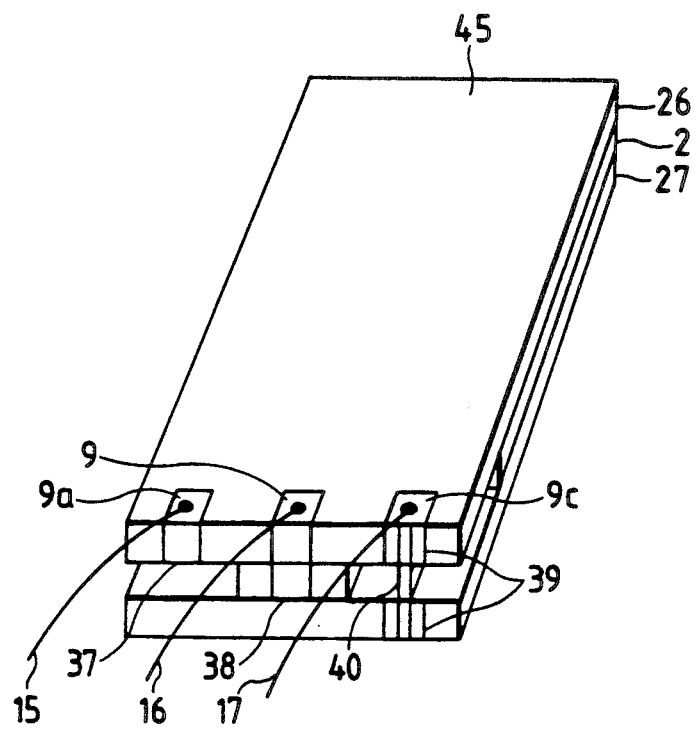
FIG. 20 is an elevation of an embodiment of the accelerometer shown in FIG. 17.

FIG. 20 is an elevation view of the detection unit shown in FIG. 17, in which the lead-out terminal 32, silicon plate 2 and lead-out terminal 33 are electrically connected with the bonding pads 9a, 9 and 9c through conductive paste portions 37, 38 and 39. In addition, the conductive paste portions may be electrically connecting means other than the conductive paste. Also, two conductive paste portions 39 are electrically connected by connecting means, such as a conducting wire 40.

Thus, the detection unit is connected with the external signal processing circuit through the conducting wires 15, 16 and 17.

Figure 21:
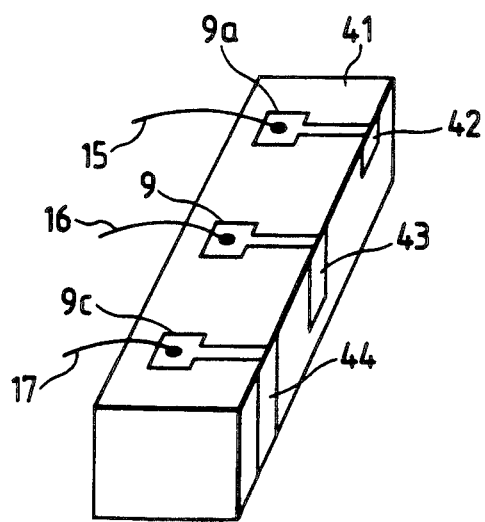
FIG. 21 is a schematic view of an embodiment of an terminal assembly of the accelerometer shown in FIG. 20.

Still another modified embodiment for connecting the detection unit and external signal processing circuit is shown in FIG. 21, in which the bonding pads 9a, 9 and 9c are formed on a terminal assembly 41. As the side surface thereof are formed conductive paste portions 42, 43 and 44.

In this embodiment, the terminal assembly 41 is disposed at the left end of detection unit shown in the former drawing and the conductive paste portions 37, 38 and 39 are brought into contact with portions 42, 43 and 44 respectively. Thereafter, these conductive paste portions are baked at a low temperature so as to electrically connect the electrodes at the detection unit with the bonding pads.

Figure 22:
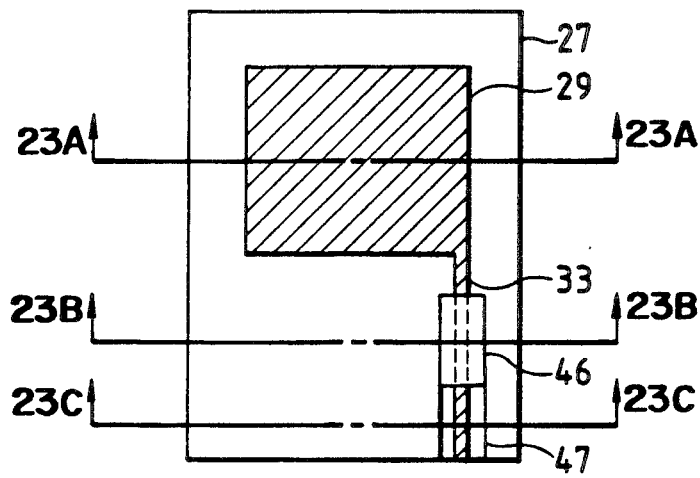
FIG. 22 is an another embodiment showing the electrode lead package method of the present invention.

A further modified embodiment of the lead package method for the detection unit of the present invention is shown in FIG. 22, which shows the third method of the invention and is different from that shown in FIG. 19 in the following point. Namely, the grooves 34 and 35 provided at the silicon plate 2 for the lead-out terminal of the fixed electrode are deleted and they are disposed at the glass plates 26 and 27 respectively.

In the FIG. 22 embodiment, a groove 47 is formed at the glass plate 27 and a lead-out terminal 33 is disposed at the bottom of the groove 47. An insulating material 46 is filled in part of groove 47 as shown. In addition, the insulating material 46 is composed of glassy material or the like.

Figure 23A:
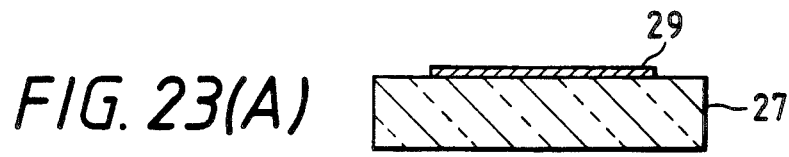
FIGS. 23(A), 23(B) and 23(C) are diagrammatic cross-sectional views taken on the lines 23A—23A, 23B—23B and 23C—23C of the accelerometer shown in FIG. 22.
Figure 23B:
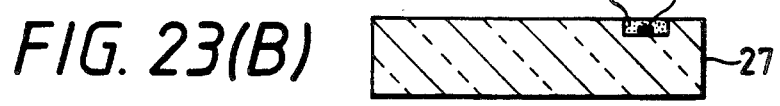
Figure 23C:
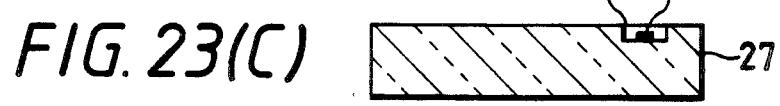

FIGS. 23(A), 23(B) and 23(C) are sectional views taken on the lines 23A—23A, 23B-23B and 23C—23C in FIG. 22. As shown in FIGS. 23(A) through 23(C), the insulating material 46 is completely filled in part of groove 47 at the upper surface with the upper surface of glass plate 27. Therefore, there is no hindrance when the glass plate 27 and silicon plate 2 are anodic-bonded, thereby not creating a gap at the junction after both the members are bonded. As the result, after the glass plates 26 and 27 are anodic-bonded in the wafer state, even when the usual dicing saw is used to cut the plates into detection chips, there is no fear that water content or chips enter into the space around the movable electrode 7.

Figure 24:
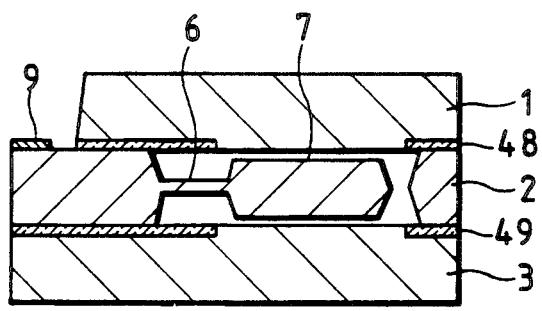
FIGS. 24 and 25 are diagrammatic cross-sectional views showing another embodiments of the electrode lead in the present invention.

A still further modified embodiment of the lead package method of the detection unit of the invention is shown in FIG. 24, in which the fourth method is shown. A basic construction of detection unit well resembles to that shown in FIG. 1, but is different only in the following point. In other words, low-melting-point glass adhesives 48 and 49 are provided in place of the thermal oxidation films 4 and 5, the low-melting-point glass is molten at a high temperature, and the silicon plates 1 and 3 are bonded in the wafer state onto both the surfaces of the silicon plate 2. In addition, the low-melting point glass adhesives 48 and 49 are formed at the shallow etched portions at the silicon plates 1 and 3 by a screen process printing or the like.

In this embodiment, since the silicon plates 1 and 3 serve also as the fixed electrodes, the same effect as the first method in FIG. 1 is obtainable.

Figure 25:
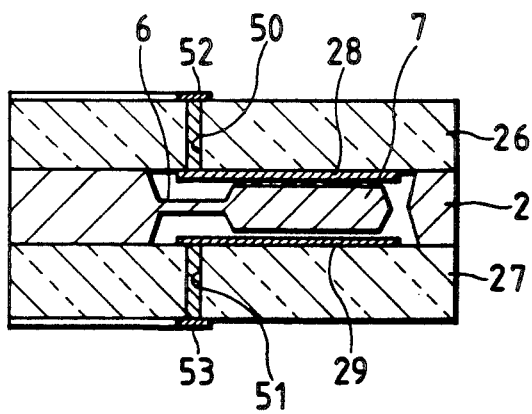

Yet another modified embodiment of the lead package method of the detection unit of the invention is shown in FIG. 25, in which the fifth method is shown. Glass plates 26 and 27, on which fixed electrodes 28 and 29 are formed by sputtering or other methods, are anodic-bonded onto the upper and lower surfaces of a silicon plate 2 having a silicon beam 6 and a movable electrode 7, the glass plates being provided with through-holes 50 and 51 formed by sand blasting or ultrasonic machining. Conductive material is filled in the through holes 50 and 51 in a manner of sealing them, and lead-out terminals 52 and 53 are provided on the holes 50 and 51 respectively.

This embodiment, which completely fills the conductive material into the through holes at the glass plate, is free from poor connection and improves the yield during the manufacturing. Since the through holes are completely sealed, even when the dicing saw cuts the plates into detection chips, water content or chips are prevented from entering into the space around the electrode.

Figure 26A:
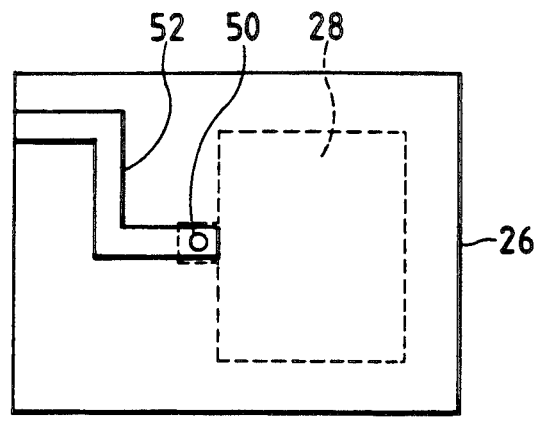
FIGS. 26(A), 26(B) and 26(C) are developed plane views of the embodiments of the accelerometer shown in FIG. 25.
Figure 26B:
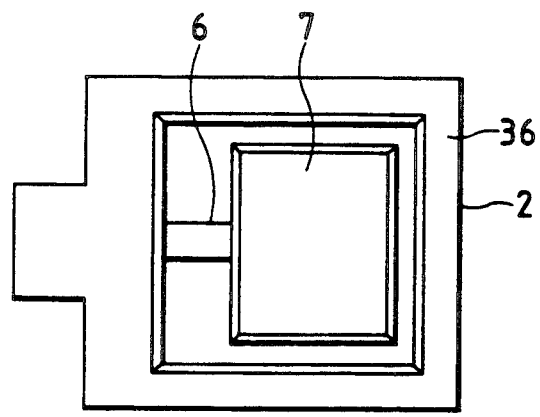
Figure 26C:
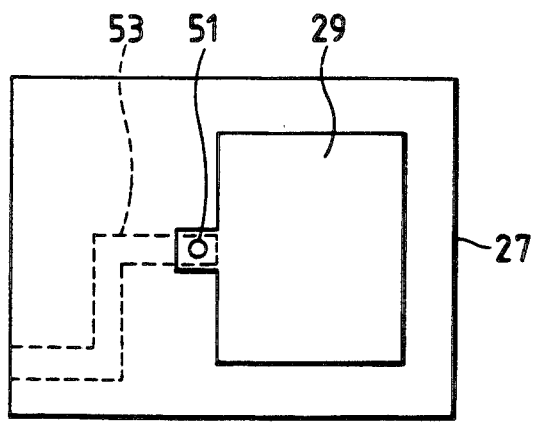

FIGS. 26(A), 26(B) and 26(C) are developed plan views of the detection unit shown in FIG. 25, in which a hatched portion at the silicon plate 2 shows a bonding portion to the glass plate. The lead-out terminals 52 and 53 at the fixed electrodes 28 and 29 are bent on the glass plates 26 and 27 as shown in the drawing.

Figure 27:
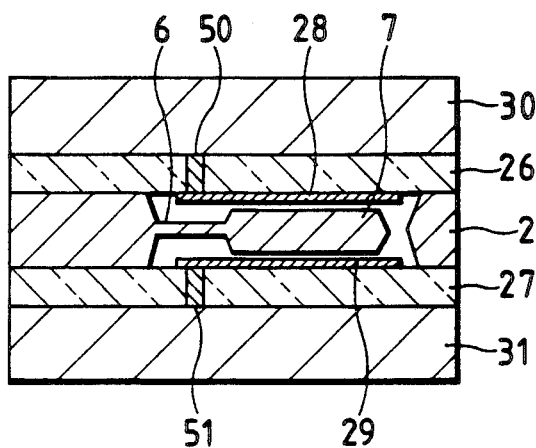
FIGS. 27, 28 and 29 are diagrammatic cross-sectional views showing another embodiments of the electrode lead package method in the present invention.

Still a further modified embodiment of the lead package method of the detection unit of the invention is shown in FIG. 27. The construction of detection unit in FIG. 27 may be considered to anodic-bond silicon plates 30 and 31 with the glass plates 26 and 27. This method is to electrically connect the fixed electrodes 28 and 29 to the silicon plates 30 and 31 through the conductive materials filled in the through holes 50 and 51. The anodic bonding in the wafer state is carried out in the following order. At first, the glass plates 26 and 27 are anodic-bonded onto the upper and lower surfaces of the silicon plate 2 respectively. Next, the silicon plates 30 and 31 are anodic-bonded onto the glass plates 26 and 27 respectively.

When the order of anodic-bonding is changed in this embodiment, the detection unit must be devised of its construction. In other words, the glass plate 26 and silicon plate 30, and the glass plate 27 and silicon plate 31, are formed in separate sets of anodic-bonding and then these sets are anodic-bonded onto the upper and lower surfaces of silicon plate 2.

In a case where such bonding methods is applied to the construction of detection unit in FIG. 27, when high voltage is applied thereto during the anodic-bonding, the movable electrode 7 is attracted by an electrostatic force to the fixed electrode 28 or 29 so as to contact therewith and discharge, thereby not performing the anodic-bonding.

Figure 28:
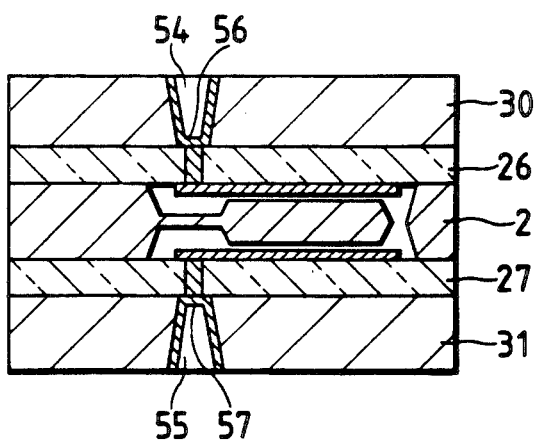

In this case, the countermeasure for the above is to change the detection unit construction as shown in FIG. 28. In detail, etching holes 54 and 55 are formed by etching onto parts of the silicon plates 30 and 31 opposite to the through holes 50 and 51 respectively. At first, the silicon plate 30 and glass plate 26, and the silicon plate 31 and glass plate 27 are anodic-bonded into separate sets, the sets being anodic-bonded onto the upper and lower surfaces of silicon plate 2, at which time, even when high voltage is applied between the silicon plate 2 and the silicon plate 30 or 31, the silicon plates 30 and 31 are electrically insulated from the fixed electrodes 28 and 29, thereby not generating any hindrance to the anodic-bonding. At the point of time when the anodic-bonding is completed, conductive members 56 and 57 are formed inside the etching bores 54 and 55 by the sputtering or the like, and the silicon plate 30 and fixed electrode 28, and the silicon plate 31 and fixed electrode 29 need only be electrically connected respectively.

The lead package method for the fixed electrode at the detection unit shown in FIGS. 27 and 28 has the same effect in productivity as that shown in FIG. 25. The detection unit in the embodiment in FIGS. 27 and 28 can rather essentially approach the silicon layers, thereby enabling the accelerometer superior in temperature characteristic to be realized.

Figure 29:
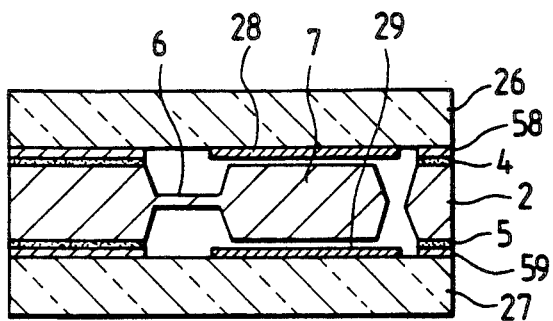

A yet further modified embodiment of the lead package method for the detection unit of the invention will be shown in FIG. 29, in which the sixth method of the invention is shown. Thermal oxidation films 4 and 5 and polycrystal silicon layers 58 and 59 thereon are formed at a bonding portion of a silicon plate 2 having a silicon beam 6 and a movable electrode 7. Glass plates 26 and 27 having fixed electrodes 28 and 29 are bonded onto the upper and lower surfaces of the silicon plate 2 through the polycrystal silicon layers 58 and 59.

Figure 30:
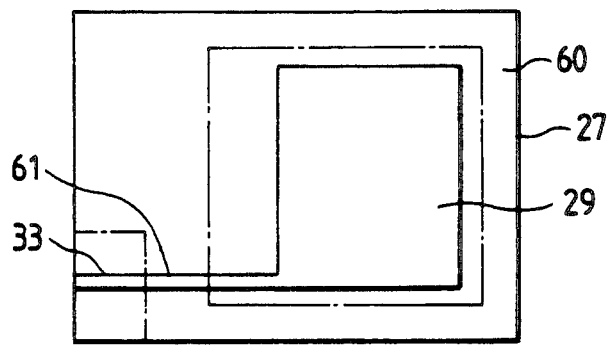
FIG. 30 is a developed plane view of the embodiments of the accelerometer shown in FIG. 29.

FIG. 30 is a plan view of the glass plate 27, in which a hatched portion is to be bonded with the silicon plate 2 through a polycrystal silicon layer 59. A lead-out terminal 33 electrically contacts at an intersection 61 with the polycrystal silicon layer 59. However, since the thermal oxidation film 5 is formed below the polycrystal silicon layer 59, the lead-out terminal 33, that is, the fixed electrode 29 is electrically insulated from the silicon plate 2. In this case, there is no need that, in order to insulate the lead of fixed electrode from the silicon plate 2, grooves are formed at the positions of both the silicon plate and glass plate opposite to the lead-out terminal. Accordingly, when the lead-out terminal is smaller in thickness, a gap created at the intersection 61 after bonding is extremely small. As the result, after the bonding in the wafer state, even when the usual dicing saw is used to cut the silicon plates into detection chips, water content or chips are prevented from entering into the space around the movable electrode.

Figure 31:
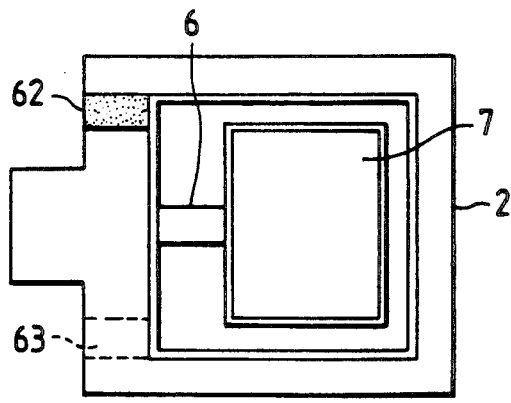
FIG. 31 is a diagrammatic view showing another embodiments of the electrode lead package method in the present invention.

FIG. 31 shows a yet further modified embodiment of the lead package method at the detection unit, in which the seventh method of the invention is shown. The detection unit is constructed in section like that shown in FIG. 17, but the lead package method is different from the following point. Namely, at the positions of the silicon plate 2 corresponding to the lead-out terminals 32 and 33 at the fixed electrodes 28 and 29 are formed thermal oxidation films 62 and 63 instead of the grooves. When the thermal oxidation films are designed to a minimum for the purpose of electrically insulating the lead-out terminals and silicon plate, a gap created in the vicinity of the films after the anodic-bonding need only be extremely small. As a result, even when the silicon plate is cut into detecting chips by the usual dicing saw, chips are prevented from entering into the space around the movable electrode.

An example of connecting the silicon capacitance type accelerometer with a signal processing circuit to evaluate the characteristic thereof.

Figure 32:
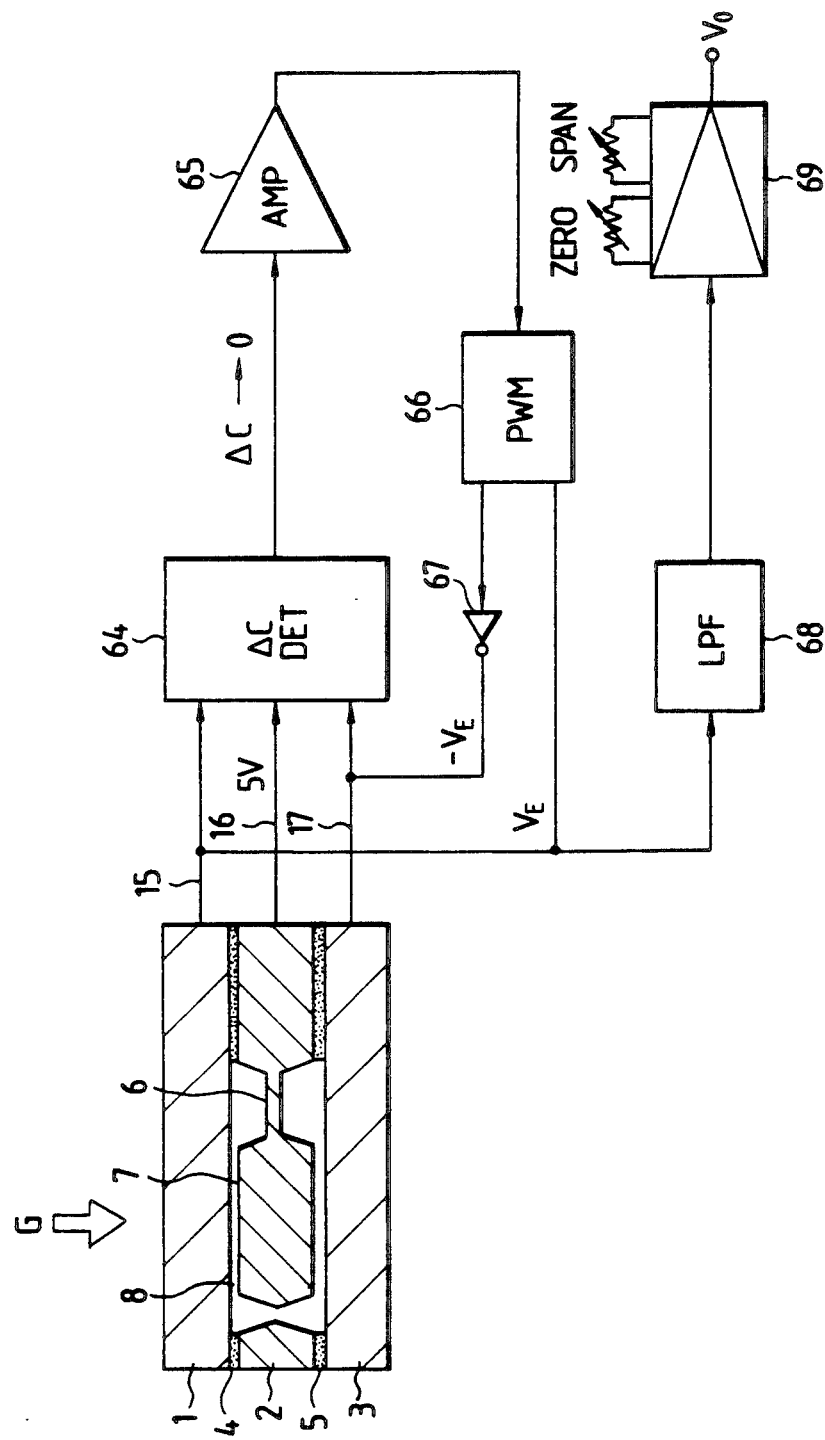
FIG. 32 is a circuit diagram showing an embodiment of a signal processing circuit of an electro-static capacitance type accelerometer.

FIG. 32 shows construction of the signal processing circuit. A detection unit shown in the drawing is essentially the same as that described in FIG. 1, in which the acceleration to be detected is defined by G, that in the direction of the arrow is defined to be positive, and that in the direction reverse to the arrow negative. Silicon plates 1, 2 and 3 are connected to a ΔC detector 64 through conductive wires 15, 16 and 17. The ΔC detector 64 comprises a switch and capacitors, and an amplifier 65 so controls a pulse width modulator 66 that a capacitance difference ΔC of the gaps 8 between the movable electrode 7 and the silicon plate 1 and 3 (serving also as the fixed electrode) becomes zero. Pulse-like output voltage $V_E$ is applied to the silicon plate 1 and output voltage $-V_E$ inverted by an inverter 67 to the silicon plate 3 in a feedback control manner. In addition, the silicon plate 2 is applied with constant DC voltage (In the drawing, 5 volts). A movable electrode 7 supported by a silicon beam 6 and functioning as a weight is intended to shift corresponding to magnitude of acceleration G. However, the position of movable electrode is controlled in a feedback manner by an electrostatic force acting between the electrodes. Therefore, electrostatic energy supplied between the electrodes leads to represent the acceleration G itself to be detected. Hence, the pulse-like output voltage waveform $V_E$ of pulse width modulator 66 is processed by a low-pass filter 68 and output voltage $V_O$ is fetched as the accelerometer output through a differential amplifier 69.

Figure 33:
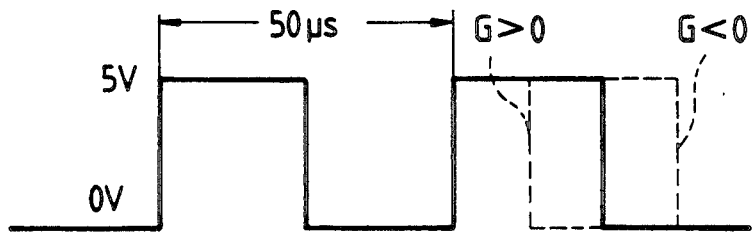
FIG. 33 is a voltage wave form of a pulse width modulator.

FIG. 33 shows the wave form of output voltage $V_E$ of the pulse width modulator. As seen from FIG. 33, the output voltage $V_E$ is pulse-like voltage waveform of a cycle period of 50 μS, and its low level is 0 volt, its high level 5 volts. The pulse width is controlled to linearly decrease with respect to the positive acceleration and increase to the negative acceleration.

Figure 34:
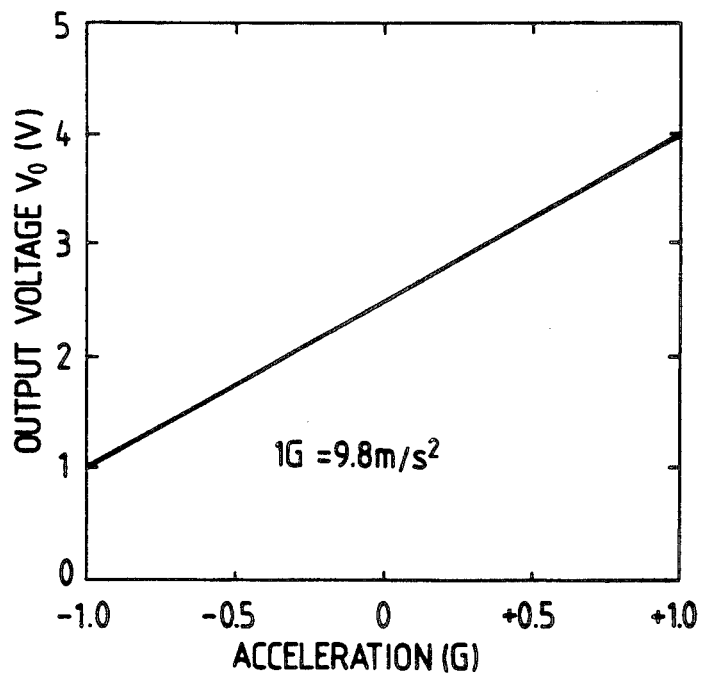
FIG. 34 is an output characteristic view of the accelerometer.

An example of the output characteristic of the silicon capacitance type accelerometer is shown in FIG. 34, which shows the result of measurement by the method shown in FIG. 32. As apparent from the above, acceleration of 0 to ±1G could be detected with good linearity and in high accuracy.

The present invention can easily and reliably connect the detection unit and the exterior without creating any problem in package of the electrode lead, whereby the capacitance type accelerometer or the semiconductor pressure sensor superior in productivity, of high performance, and inexpensive to produce, can be provided with ease.

We claim:

1. A capacitance type accelerometer, having:
    a silicon plate including a portion formed as a movable electrode which is moved according to acceleration;
    glass plates respectively mounting a conductive layer thereon which are opposite to the silicon plate with a certain separation distance and are connected to both sides of the silicon plate except the movable electrode; and
    lead wires which are respectively connected to the conductive layers through at least one preformed groove provided in at least one of the silicon plate and the glass plates.

2. A capacitance type accelerometer as defined in claim 1, wherein;
    the groove is formed on the silicon plate.

3. A capacitance type accelerometer as defined in claim 1, wherein;
    the groove is formed on the glass plates.

4. A capacitance type accelerometer as defined in claim 1, wherein;
    the groove is filled with a non-conductive material.

5. A capacitive type accelerometer having:
    a silicon plate including a portion formed as a movable electrode which is moved according to acceleration;
    glass plates respectively mounting a conductive layer thereon which are opposite to the silicon plate with a certain separation distance and are connected to both sides of the silicon plate except the movable electrode;
    lead wires which are respectively connected to the conductive layers through at least one groove formed in at least one of the silicon plate and the glass plates; and
    silicon plates respectively covering each outside surface of the glass plates.

6. A capacitance type accelerometer as defined in claim 5, further having;
    conductive paste electrically connecting one of the lead wires to a connecting terminal.

7. A capacitance type accelerometer, having:
    a silicon plate including a portion formed as a movable electrode which is moved according to accelerating force;
    glass plates respectively mounting a conductive layer thereon which are opposite to the silicon plate with a certain separation distance and are anodic-bonded to both sides of the silicon plate except the movable electrode; and
    lead wires which are respectively connected to the conductive layer and are respectively fed out of the glass plate through a hole formed thereon.

8. A capacitance type accelerometer, having:

a silicon plate including a portion formed as a movable electrode which is moved according to acceleration;
thermal oxide films which are respectively formed on the silicon plate except the movable electrode;
polycrystal silicon layer formed on the thermal oxide films;
glass plates respectively mounting a conductive layer thereon which are opposite to the silicon plate with a certain separation distance and are connected to both sides of the silicon plate through the thermal oxide films and the polycrystal silicon layer except the movable electrode; and
thin lead wires which respectively connect lead out terminals to the conductive layers through portions between the thermal oxide films and the glass plates and are connected to the polycrystal silicon layer.

9. A capacitance type accelerometer comprising:
a silicon plate including a portion formed as a movable electrode which is moved in response to acceleration;
first and second plate members disposed on opposite sides of the silicon plate and being spaced at least from the movable electrode portion of the silicon plate, the plate members being connected to the silicon plate other than in the region of the movable electrode portion;
wherein the first and second plate members are glass plate members, each glass plate member having a conductive layer mounted thereon and disposed in opposition to the movable electrode portion of the silicon plate; and
lead wires respectively connected to the conductive layers through at least one preformed groove provided in at least one of the silicon plate and the glass plate members.

10. A capacitance type accelerometer according to claim 9, further comprising silicon plates respectively covering each outside surface of the glass plates.

11. A capacitance type accelerometer according to claim 9, wherein the groove is filled with a non-conductive material.

* * * * *